(12) United States Patent
Yoon

(10) Patent No.: US 12,641,872 B2
(45) Date of Patent: May 26, 2026

(54) SEMICONDUCTOR DEVICE AND A METHOD OF MANUFACTURING THE SEMICONDUCTOR DEVICE

(71) Applicant: SK hynix Inc., Gyeonggi-do (KR)

(72) Inventor: Young Gwang Yoon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 536 days.

(21) Appl. No.: 18/177,760

(22) Filed: Mar. 3, 2023

(65) Prior Publication Data

US 2024/0072053 A1 Feb. 29, 2024

(30) Foreign Application Priority Data

Aug. 26, 2022 (KR) ........................ 10-2022-0107627

(51) Int. Cl.
| | |
|---|---|
| *H10D 30/69* | (2025.01) |
| *H10D 30/01* | (2025.01) |
| *H10D 64/68* | (2025.01) |
| *H10D 84/01* | (2025.01) |
| *H10D 84/03* | (2025.01) |
| *H10D 84/85* | (2025.01) |

(52) U.S. Cl.
CPC ......... *H10D 84/85* (2025.01); *H10D 30/0415* (2025.01); *H10D 30/701* (2025.01); *H10D 64/689* (2025.01); *H10D 84/0181* (2025.01); *H10D 84/038* (2025.01)

(58) Field of Classification Search
None
See application file for complete search history.

(56) References Cited

U.S. PATENT DOCUMENTS

2010/0133623 A1 6/2010 Inumiya et al.
2021/0399104 A1* 12/2021 Chang ................... H10D 30/62

\* cited by examiner

*Primary Examiner* — Xiaoming Liu
(74) *Attorney, Agent, or Firm* — IP & T GROUP LLP

(57) ABSTRACT

A semiconductor device includes a first gate stack and a second gate stack disposed on a substrate. The first gate stack includes a first lower gate insulating layer. The second gate stack includes a second lower gate insulating layer. The first lower gate insulating layer includes silicon oxide with a first dipole material. The second lower gate insulating layer includes silicon oxide with a second dipole material. The first dipole material and the second dipole material are different from each other.

16 Claims, 9 Drawing Sheets

100

11

NA

200

12

PA

11

NA

12

PA

11

NA

12

PA

SEMICONDUCTOR DEVICE AND A METHOD OF MANUFACTURING THE SEMICONDUCTOR DEVICE

CROSS-REFERENCE TO RELATED APPLICATIONS

The present application claims priority under 35 U.S.C. § 119 to Korean Patent Application No. 10-2022-0107627, filed on Aug. 26, 2022 in the Korean Intellectual Property Office, which is incorporated herein by reference in its entirety.

BACKGROUND

1. Field

Various embodiments of the present disclosure provide a semiconductor device having an NMOS transistor and a PMOS transistor and a method of manufacturing the semiconductor device.

2. Description of the Related Art

As the integration degree of semiconductor devices increases, it is difficult to lower a threshold voltage of an NMOS transistor and a threshold voltage of a PMOS transistor, and it is also difficult to control thickness of an inversion area.

SUMMARY

The present invention disclosure provides a method of lowering a threshold voltage of an NMOS transistor and a threshold voltage of a PMOS transistor.

An embodiment of the present disclosure provides an NMOS transistor and a PMOS transistor including dipole materials different from each other.

An embodiment of the present disclosure provides a method of manufacturing an NMOS transistor and a PMOS transistor.

A semiconductor device in accordance with an embodiment of the present disclosure may include a first gate stack and a second gate stack disposed on a substrate. The first gate stack may include a first lower gate insulating layer. The second gate stack may include a second lower gate insulating layer. The first lower gate insulating layer may include silicon oxide with a first dipole material. The second lower gate insulating layer may include silicon oxide with a second dipole material. The first dipole material and the second dipole material may be different from each other.

A semiconductor device in accordance with an embodiment of the present disclosure may include a substrate having a first area and a second area; a first gate stack disposed on the first area of the substrate; and a second gate stack disposed on the second area of the substrate. The first gate stack may include a first gate insulating layer disposed on the substrate; and a first gate electrode on the first gate insulating layer. The second gate stack may include a second gate insulating layer disposed on the substrate; and a second gate electrode on the second gate insulating layer. The first gate insulating layer may include an N-type dipole material. The second gate insulating layer may include a P-type dipole material.

A method of manufacturing a semiconductor device in accordance with an embodiment of the present disclosure may include forming a first preliminary lower gate insulating layer on a first area and a second area of a substrate; forming a first dipole material layer on the first preliminary lower gate insulating layer; forming a silicon source layer on the first dipole material layer; forming a first lower gate insulating layer by performing a first annealing process to diffuse the first dipole material in the first dipole material layer and silicon atoms in the silicon source layer into the first preliminary lower gate insulating layer so that the first preliminary lower gate insulating layer and the first dipole source layer are formed into the first lower gate insulating layer; removing the silicon source layer and the first lower gate insulating layer in the second area of the substrate; forming a second lower gate insulating layer including a second dipole material on the second area of the substrate; forming a first upper gate insulating layer on the first lower gate insulating layer and forming a second upper gate insulating layer on the second lower gate insulating layer; and forming a first gate electrode on the first upper gate insulating layer and forming a second gate electrode on the second upper gate insulating layer. The first dipole material and the second dipole material may be different from each other.

A method of manufacturing a semiconductor device in accordance with an embodiment of the present disclosure may include forming a first preliminary lower gate insulating layer on a substrate having a first area and a second area; forming a first dipole material layer on the first preliminary lower gate insulating layer; forming a silicon source layer on the first dipole material layer; forming a first lower gate insulating layer by performing a first annealing process to diffuse the first dipole material in the first dipole material layer and silicon atoms in the silicon source layer into the first preliminary lower gate insulating layer so that the first preliminary lower gate insulating layer and the first dipole source layer are formed into the first lower gate insulating layer; exposing a surface of the substrate in the second area by removing the silicon source layer, the first dipole material layer. The first lower gate insulating layer in the second area of the substrate; forming a second preliminary lower gate insulating layer on the exposed surface of the substrate in the second area; exposing the first lower gate insulating layer by removing the silicon source layer and the first dipole material layer in the first area; and forming an upper gate insulating layer on the first lower gate insulating layer and the second preliminary lower gate insulating layer.

DETAILED DESCRIPTION

Figure 1:
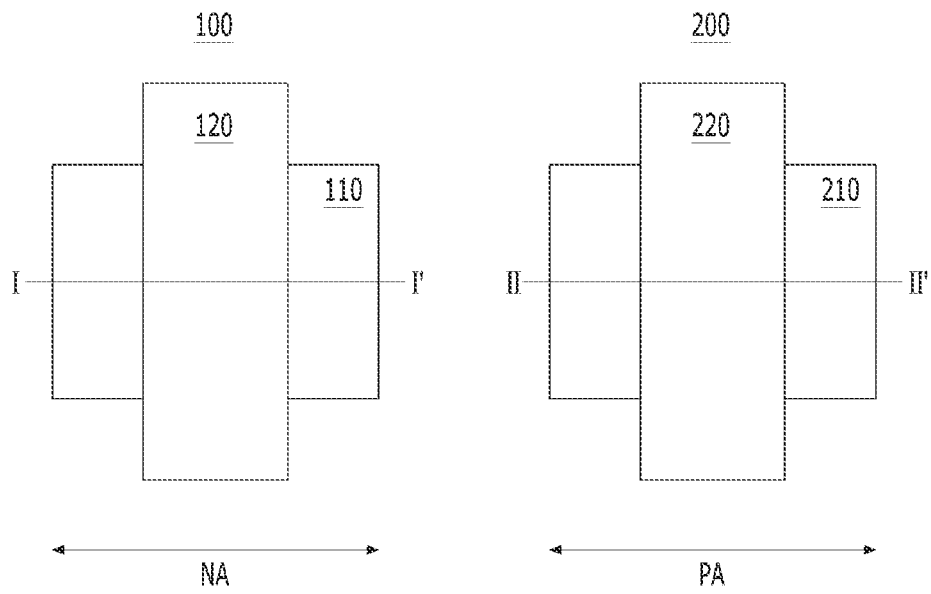
FIG. 1 is a layout schematically illustrating an NMOS transistor and a PMOS transistor of a semiconductor device according to an embodiment of the present disclosure.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It will be understood that, although the terms "first" and/or "second" may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Other expressions that explain the relationship between elements, such as, for example, "between", "directly between", "adjacent to" or "directly adjacent to" should be construed in the same way.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIG. 1 is a layout schematically illustrating an NMOS transistor 100 and a PMOS transistor 200 of a semiconductor device according to an embodiment of the present disclosure. Referring to FIG. 1, a semiconductor device according to an embodiment of the present disclosure may include an NMOS transistor 100 disposed in an NMOS area NA and a PMOS transistor 200 disposed in a PMOS area PA. The NMOS transistor 100 may include a P-type active region 110 and an N-type gate electrode 120. The PMOS transistor 200 may include an N-type active region 210 and a P-type gate electrode 220. The N-type gate electrode 120 may cross the P-type active region 110. The P-type gate electrode 220 may cross the N-type active region 210. The P-type active region 110 may include a P-well with P-type impurity ions such as, for example, boron (B). The N-type active region 210 may include an N-well with N-type impurity ions such as, for example, phosphorus (P) or arsenic (As).

Figure 2:
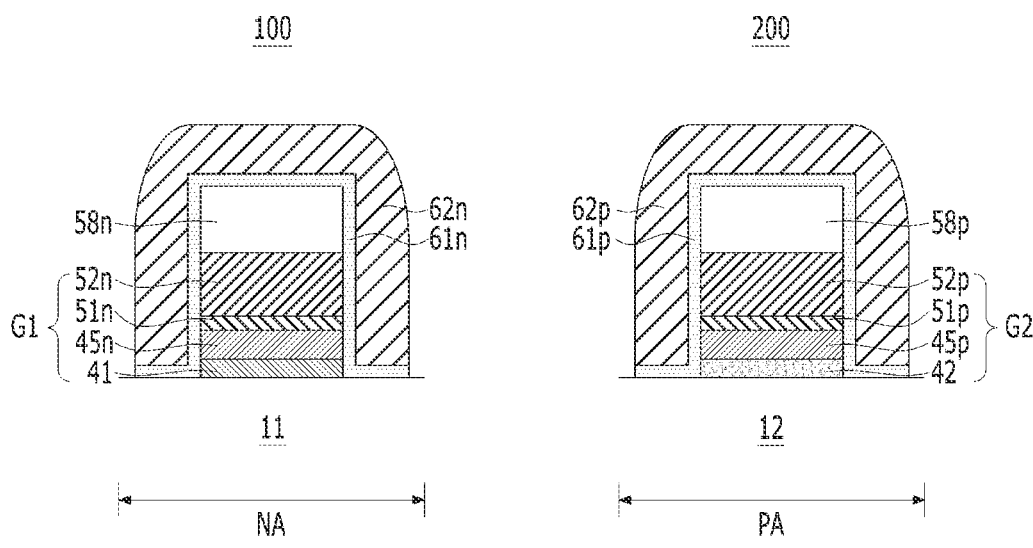
FIGS. 2 and 3 are longitudinal cross-sectional views illustrating the NMOS transistor and the PMOS transistor of the semiconductor devices according to the embodiments of the present disclosure.
Figure 3:
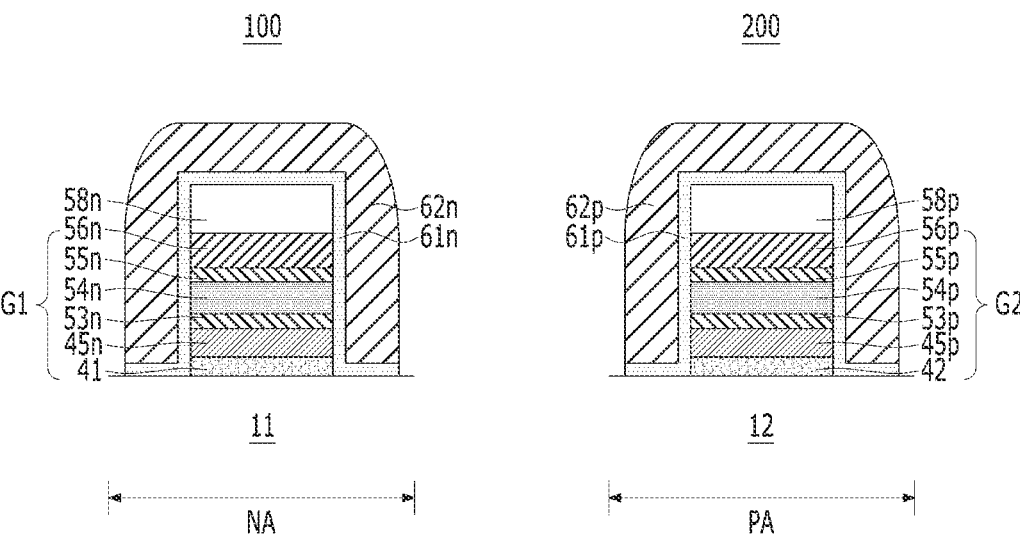

FIGS. 2 and 3 are longitudinal cross-sectional views illustrating the NMOS transistor 100 and the PMOS transistor 200, respectively. FIGS. 2 and 3 are longitudinal cross-sectional views taken along the lines I-I' and II-II' of FIG. 1, respectively.

Referring to FIG. 2, a semiconductor device according to an embodiment of the present disclosure may include an NMOS transistor 100 disposed in an NMOS area NA and a PMOS transistor 200 disposed in a PMOS area PA. The NMOS transistor 100 may include a first gate stack G1 disposed on an N-channel substrate 11, a first hard mask pattern 58n on the first gate stack G1, and first gate spacers 61n and 62n covering the first gate stack G1 and the first hard mask pattern 58n. The PMOS transistor 200 may include a second gate stack G2 disposed on a P-channel substrate 12, a second hard mask pattern 58p on the second gate stack G2, and second gate spacers 61p and 62p covering the second gate stack G2 and the second hard mask pattern 58p.

The N-channel substrate 11 and the P-channel substrate 12 may include a silicon wafer, an epitaxially grown semiconductor layer, a silicon-on-insulator (SOI), a compound semiconductor layer, or various other semiconductor layers. The N-channel substrate 11 may include an N-type channel region. For example, the N-channel substrate 11 may include a P-well doped with P-type impurity ions such as, for example, boron (B). The P-channel substrate 12 may include a P-type channel region. For example, the P-channel substrate 12 may include an N-well doped with N-type impurity ions such as, for example, phosphorous (P) or arsenic (As).

The first gate stack G1 may include a first lower gate insulating layer 41, a first upper gate insulating layer 45n, a first gate barrier layer 51n, and a first gate electrode 52n. The second gate stack G2 may include a second lower gate insulating layer 42, a second upper gate insulating layer 45p, a second gate barrier layer 51p, and a second gate electrode 52p.

The first lower gate insulating layer 41 may be directly disposed on the N-channel substrate 11. The first lower gate insulating layer 41 may include an N-type dipole material, silicon, and oxygen. For example, the first lower gate insulating layer 41 may be silicon oxide including the N-type dipole material. The N-type dipole material may include lanthanum (La). Accordingly, the first lower gate insulating layer 41 may include lanthanum silicon oxide (LaSiO). In some embodiments, the N-type dipole material may include at least one of scandium (Sc), erbium (Er), strontium (Sr), or combinations thereof. Accordingly, the first lower gate insulating layer 41 may include scandium silicon oxide (ScSiO), erbium silicon oxide (ErSiO), or strontium silicon oxide (SrSiO). In some embodiments, the first lower gate insulating layer 41 may include silicon oxide layers (LaScSiO; LaErSiO, LaSrSiO, ScErSiO, ScSrSiO, ErSrSiO, LaScErSiO, LaErSrSiO, LaScSrSiO, ScErSrSiO, and LaScErSrSiO) with at least two of lanthanum (La), scandium (Sc), erbium (Er), and strontium (Sr). For example, the first lower gate insulating layer 41 may include one of LaScSiO; LaErSiO, LaSrSiO, ScErSiO, ScSrSiO, ErSrSiO, LaScErSiO, LaErSrSiO, LaScSrSiO, ScErSrSiO, and LaScErSrSiO. In some embodiments, the first lower gate insulating layer 41 may further include a little amount of a high-k material such as, for example, hafnium (Hf). For example, the first lower gate insulating layer 41 may include hafnium lanthanum silicon oxide (HfLaSiO). In some embodiments, the first lower gate insulating layer 41 may be silicon oxide including both the high-k material and the N-type dipole material. The N-type dipole material may lower a threshold voltage of the NMOS transistor 100 and may improve a thickness of an inversion region for forming an N-type channel. The high-k materials will be described in detail below.

The second lower gate insulating layer 42 may be disposed directly on the P-channel substrate 12. The second lower gate insulating layer 42 may include the P-type dipole material, silicon, and oxygen. For example, the second lower gate insulating layer 42 may be silicon oxide with the P-type dipole material. The P-type dipole material may include aluminum (Al). Accordingly, the second lower gate insulating layer 42 may include aluminum silicon oxide (AlSiO). In some embodiments, the P-type dipole material may include niobium (Nb). Accordingly, the second lower gate insulating layer 42 may include niobium silicon oxide (NbSiO). In some embodiments, the P-type dipole material may include aluminum (Al) and niobium (Nb).

Accordingly, the second lower gate insulating layer 42 may include aluminum niobium silicon oxide (AlNbSiO). In another embodiment, the second lower gate insulating layer 42 may include a little amount of a high-k material such as, for example, hafnium (Hf). For example, the second lower gate insulating layer 42 may include hafnium aluminum silicon oxide (HfAlSiO). The P-type dipole material may lower a threshold voltage of the PMOS transistor 200 and may improve a thickness of an inversion region for forming a P-type channel.

The first upper gate insulating layers 45n may be disposed on the first lower gate insulating layer 41 in the NMOS area NA. The second upper gate insulating layer 45p may be disposed on the second lower gate insulating layer 42 in the PMOS area PA. Each of the first and second upper gate insulating layers 45n and 45p may be an oxide material including both a high-k material and the P-type dipole material. The high-k material may include at least one of metals such as, for example, hafnium (Hf), bismuth (Bi), barium (Ba), or zirconium (Zr). Accordingly, each of the first and second upper gate insulating layer 45n and 45p may include an XYO compound (X: a high-k material, Y: a P-type dipole material, O: oxygen). Accordingly, each of the first and second upper gate insulating layer 45n and 45p may be an oxide material including at least one of metals such as, for example, hafnium (Hf), bismuth (Bi), barium (Ba), or zirconium (Zr) and including at least one of aluminum (Al) and niobium (Nb). For example, each of the first and second upper gate insulating layers 45n and 45p may include hafnium aluminum oxide (HfAlO).

The first gate barrier layer 51n may be disposed on the first upper gate insulating layer 45n. The second gate barrier layer 51p may be disposed on the second upper gate insulating layer 45p. Each of the first and second gate barrier layers 51n and 51p may include a conductive barrier metal layer. For example, each of the first and second gate barrier layers 51n and 51p may include one of a titanium nitride (TiN) single-layer structure or a titanium/titanium nitride (Ti/TiN) multi-layer structure.

The first gate electrode 52n may be disposed on the first gate barrier layer 51n. The second gate electrode 52p may be disposed on the second gate barrier layer 51p. Each of the first and second gate electrodes 52n and 52p may include a conductor having high conductivity, such as, for example, tungsten (W). In an embodiment, each of the first and second gate electrodes 52n and 52p may include at least one of a metal, a metal compound, a metal alloy, a metal silicide, N-doped polysilicon, or various combinations thereof.

The first hard mask pattern 58n may be disposed on the first gate stack G1. The first hard mask pattern 58n may be disposed on the first gate electrode 52n. The second hard mask pattern 58p may be disposed on the second gate stack G2, and, more specifically, the second hard mask pattern 58p may be disposed on the second gate electrode 52p. Each of the first and second hard mask patterns 58n and 58p may include a material having an etch selectivity with respect to silicon oxide ($SiO_2$), such as, for example, silicon nitride (SiN).

The first gate spacers 61n and 62n may include a first inner gate spacer 61n and a first outer gate spacer 62n. The second gate spacers 61p and 62p may include a second inner gate spacer 61p and a second outer gate spacer 62p. Each of the first and second inner gate spacers 61n and 61p may be conformally disposed on side surfaces of the first and second gate stacks G1 and G2 and surfaces of the first and second hard mask patterns 58n and 58p. Each of the first and second inner gate spacers 61n and 61p may extend onto the surfaces of the N-channel substrate 11 and the P-channel substrate 12. The first and second inner gate spacers 61n and 61p may include silicon oxide ($SiO_2$). Each of the first and second outer gate spacers 62n and 62p may be disposed on a surface of the first and second inner gate spacers 61n and 61p to cover the first and second gate stacks G1 and G2 and the first and second hard mask patterns 58n and 58p. Each of the first and second outer gate spacers 62n and 62p may include an insulating material having an etch selectivity with respect to silicon oxide ($SiO_2$), such as, for example, silicon nitride (SiN). In an embodiment, the gate spacers 61n, 61p, 62n, and 62p may not be formed on the first and second hard mask patterns 58n and 58p. That is, the first and second inner gate spacers 61n and 61p may be formed only on the side surfaces of the first and second gate stacks G1 and G2. In another embodiment, the gate spacers 61n, 61p, 62n, and 62p may be selectively omitted. For example, at least one of the first and second inner gate spacers 61n and 61p, and the first and second outer gate spacers 62n and 62p may not be formed.

The NMOS transistor 100 may include the first lower gate insulating layer 41 with the N-type dipole material and the first upper gate insulating layer 45n with the P-type dipole material. Accordingly, the NMOS transistor 100 may have a lowered threshold voltage and an adjusted inversion region by the first lower gate insulating layer 41. The PMOS transistor 200 may include the second lower gate insulating layer 42 with the P-type dipole material and the second upper gate insulating layer 45p with the P-type dipole material. Accordingly, the PMOS transistor 200 may have a lowered threshold voltage and an adjusted inversion region by the second lower gate insulating layer 42.

In an embodiment, a concentration of the N-type dipole material in the first lower gate insulating layer 41 may be higher than the concentration of the P-type dipole material in the second lower gate insulating layer 42. In an embodiment, a first distance between a highest concentration region of the N-type dipole material in the first lower and upper gate insulating layers 41 and 45n of the NMOS transistor 100 and the N-channel substrate 11 may be smaller than a second distance between a highest concentration region of the P-type dipole material in the second lower and upper gate insulating layers 42 and 45p of the PMOS transistor 200 and the P-channel substrate 12. In other words, the first distance from a top surface of the N-channel substrate 11 to the highest concentration region of the N-type dipole material in the first lower and upper gate insulating layers 41 and 45n may be smaller than the second distance from a top surface of the P-channel substrate 12 to the highest concentration region of the P-type dipole material in the second lower and upper gate insulating layers 42 and 45p. Accordingly, the highest concentration region of the N-type dipole material is closer to the substrate 11 and 12 than the highest concentration region of the P-type dipole material. In an embodiment, the highest concentration region of the N-type dipole material may be located in the first lower gate insulating layer 41. In an embodiment, the highest concentration region of the P-type dipole material may be located in the second lower gate insulating layer 42. In an embodiment, the highest concentration region of the P-type dipole material may be located in the first and second upper gate insulating layer 45n and 45p. The concentrations and the maximum concentration regions of the N-type dipole material and the P-type dipole material may vary according to various manufacturing processes, respectively.

Referring to FIG. 3, a semiconductor device according to an embodiment of the present disclosure may include an NMOS transistor 100 disposed in an NMOS area NA and a PMOS transistor disposed in a PMOS area PA. The NMOS transistor 100 may include a first gate stack G1 disposed on an N-channel substrate 11, a first hard mask pattern 58n on the first gate stack G1, and first gate spacers 61n and 62n covering the first gate stack G1 and the first hard mask pattern 58n. The PMOS transistor 200 may include a second gate stack G2 disposed on a P-channel substrate 12, a second hard mask pattern 58p on the second gate stack G2, and second gate spacers 61p and 62p covering the second gate stack G2 and the second hard mask pattern 58p.

The first gate stack G1 may include a first lower gate insulating layer 41, a first upper gate insulating layer 45n, a first lower gate barrier layer 53n, a first lower gate electrode 54n, a first upper gate barrier layer 55n, and a first upper gate electrode 56n. The second gate stack G2 may include a second lower gate insulating layer 42, a second upper gate insulating layer 45p, a second lower gate barrier layer 53p, a second lower gate electrode 54p, a second upper gate barrier layer 55p, and a second upper gate electrode 56p.

The first and second lower gate barrier layers 53n and 53p and the first and second upper gate barrier layers 55n and 55p may be disposed on the first and second upper gate insulating layers 45n and 45p, respectively. Each of the first and second lower gate barrier layers 53n and 53p and each of the first and second upper gate barrier layers 55n and 55p may include a conductive barrier metal layer. For example, each of the first and second lower gate barrier layers 53n and 53p and each of the first and second upper gate barrier layers 55n and 55p may include one of a titanium nitride (TiN) single-layer structure or a titanium/titanium nitride (Ti/TiN) multi-layer structure. In an embodiment, each of the first and second lower gate barrier layers 53n and 53p may include a titanium nitride (TiN) single-layer structure, and each of the first and second upper gate barrier layers 55n and 55p may include a titanium/titanium nitride (Ti/TiN) multi-layer structure.

The first lower gate electrode 54n may be disposed on the first lower gate barrier layer 53n. The second lower gate electrode 54p may be disposed on the second lower gate barrier layer 53p. Each of the first and second lower gate electrodes 54n and 54p may include an N-type ions doped polysilicon. In an embodiment, each of the first and second lower gate barrier layers 53n and 53p may further include a metal silicide such as, for example, titanium silicide (TiSi).

The first upper gate electrode 56n may be disposed on the first upper gate barrier layer 55n. The second upper gate electrode 56p may be disposed on the second upper gate barrier layer 55p. Each of the first and second upper gate electrodes 56n and 56p may include a conductor having high conductivity, such as, for example, tungsten (W). Elements not described may be understood with reference to FIG. 2.

FIGS. 4 to 13 are longitudinal cross-sectional views illustrating a method of manufacturing an NMOS transistor and a PMOS transistor of a semiconductor device according to an embodiment of the present disclosure.

Figure 4:
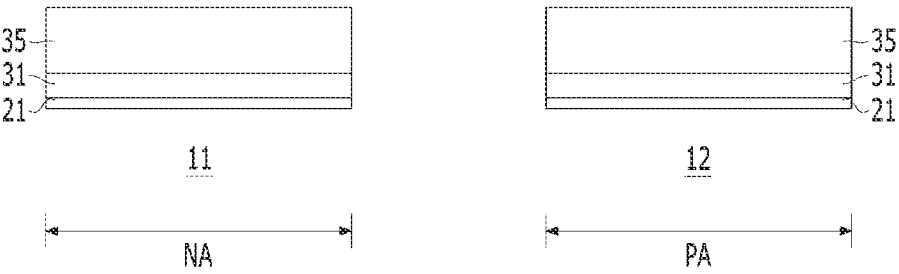
FIGS. 4 to 13 are longitudinal cross-sectional views illustrating a method of manufacturing an NMOS transistor and a PMOS transistor of a semiconductor device according to an embodiment of the present disclosure.

Referring to FIG. 4, a method of manufacturing an NMOS transistor and a PMOS transistor of a semiconductor device according to an embodiment of the present disclosure may include forming a preliminary lower gate insulating layer 21 on substrates 11 and 12 with an NMOS area NA a PMOS area PA, forming a first dipole source layer 31 on the first preliminary lower gate insulating layer 21, and forming a silicon source layer 35 on the first dipole source layer 31.

The substrates 11 and 12 may include a single crystalline silicon layer such as, for example, a silicon wafer, an epitaxially grown semiconductor layer, a silicon-on-insulator (SOI), a compound semiconductor layer, or various other semiconductor layers. The substrates 11 and 12 may include an N-channel substrate 11 including a P-well in the NMOS area NA and a P-channel substrate 12 including an N-well in the PMOS area PA. The N-channel substrate 11 may correspond to the P-type active region 110 of FIG. 1. The P-channel substrate 12 may correspond to the N-type active region 210 of FIG. 1.

Forming the first preliminary lower gate insulating layer 21 may include oxidizing surfaces of the substrates 11 and 12 or depositing a silicon oxide layer on the surfaces of the substrates 11 and 12. Accordingly, the first preliminary lower gate insulating layer 21 may include an oxidized silicon layer or a deposited silicon oxide layer. In an embodiment, the first preliminary lower gate insulating layer 21 may be formed at a high temperature higher than or equal to about 800° C.

Forming the first dipole source layer 31 may include forming an insulating layer with a first dipole material on the first preliminary lower gate insulating layer 21 by performing a deposition process. The first dipole material may include an N-type dipole material lowering a threshold voltage of the NMOS transistor. For example, the first dipole material may include lanthanum (La). Accordingly, the first dipole source layer 31 may include lanthanum oxide (LaO). In some embodiments, the first dipole material may include at least one of scandium (Sc), erbium (Er), strontium (Sr), or combinations thereof. Accordingly, the first dipole source layer 31 may include at least one of scandium oxide (ScO), erbium oxide (ErO), or strontium oxide (SrO). In some embodiments, the first dipole source layer 31 may include at least one of oxide layers with at least two of Lanthanum (La), scandium (Sc), erbium (Er), or strontium (Sr). Accordingly, the first dipole source layer 31 may include at least one of LaScO, LaErO, LaSrO, ScErO, ScSrO, ErSrO, LaScErO, LaErSrO, LaScSrO, ScErSrO, and LaScErSrO.

Forming the silicon source layer 35 may include forming an amorphous silicon layer on the first dipole source layer 31 by performing a deposition process. The silicon source layer 35 may be in an amorphous state so that silicon atoms can easily diffuse and move.

Figure 5:
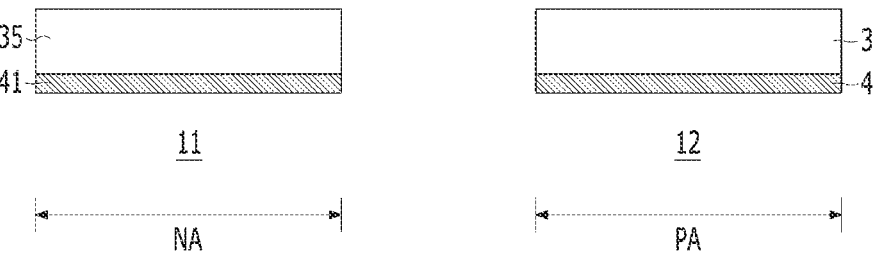

Referring to FIG. 5, the method may further include forming a first lower gate insulating layer 41 by performing a first annealing process. During the first annealing process, silicon atoms in the silicon source layer 35 may diffuse into the first dipole source layer 31 and the first preliminary lower gate insulating layer 21. The first dipole material in the first dipole source layer 31 may diffuse into the first preliminary lower gate insulating layer 21. Accordingly, the first preliminary lower gate insulating layer 21 and the first dipole source layer 31 may be formed into the first lower gate insulating layer 41. The first lower gate insulating layer 41 may include the first dipole material, silicon, and oxygen. For example, the first lower gate insulating layer 41 may include lanthanum silicon oxide (LaSiO). In some embodiments, the first lower gate insulating layer 41 may include at least one of the materials described with reference to FIG. 2. That is, a compound layer having the first dipole material may be formed adjacent to the substrates 11 and 12.

Figure 6:
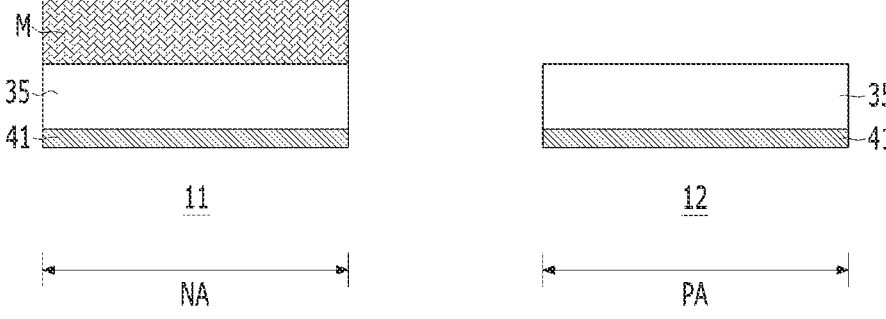

Referring to FIG. 6, the method may further include forming a mask pattern M on the silicon source layer 35 of the NMOS area NA. The mask pattern M may cover the NMOS area NA and expose the PMOS area PA. Forming the mask pattern M may include performing a deposition process or a spin coating process, and a photolithography process. The mask pattern M may include an inorganic material layer such as, for example, spin-on-glass (SOG), spin-on-carbon (SOC), spin-on-dielectric (SOD), spin-on-hard mask (SOH), silicon oxide ($SiO_2$), and silicon nitride (SiN), or an organic material layer such as, for example, photoresist.

Figure 7:
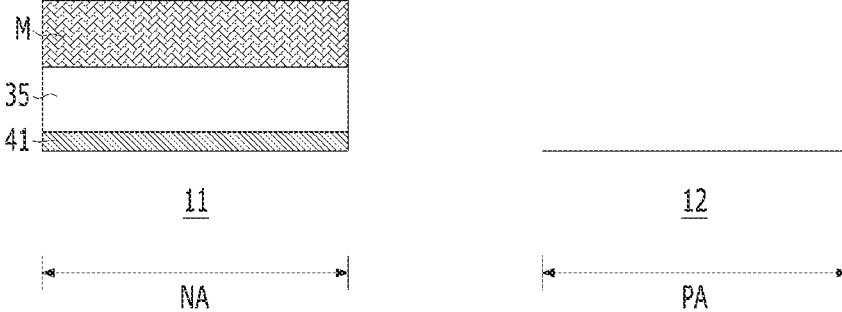

Referring to FIG. 7, the method may further include removing the silicon source layer 35 and the first lower gate insulating layer 41 in the PMOS area PA by performing an etching process. A surface of the P-channel substrate 12 may be exposed in the PMOS area PA.

Figure 8:
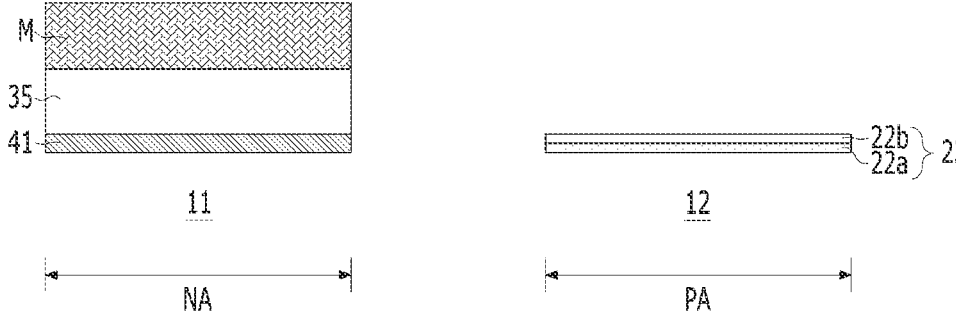

Referring to FIG. 8, the method may further include forming a second preliminary lower gate insulating layer 22 on the surface of the P-channel substrate 12 exposed PMOS area PA. Forming the second preliminary lower gate insulating layer 22 may include forming a bottom layer 22a and a top layer 22b on the surface of the P-channel substrate 12. The bottom layer 22a may include a P-type dipole material. For example, the bottom layer 22a may include aluminum (Al). Forming the bottom layer 22a may include treating the surface of the P-channel substrate 12 by performing a Tri-Methyl Aluminum (TMA) cleaning process. The bottom layer 22a may be thinly formed on the P-channel substrate 12 by the TMA cleaning process. Forming the top layer 22b may include performing a chemical vapor deposition (CVD) process to form a silicon oxide layer on the bottom layer 22a. The mask pattern M or the silicon source layer 35 in the NMOS area NA may protect the first lower gate insulating layer 41 in the NMOS area NA during the process of forming the bottom layer 22a and the top layer 22b.

Figure 9:
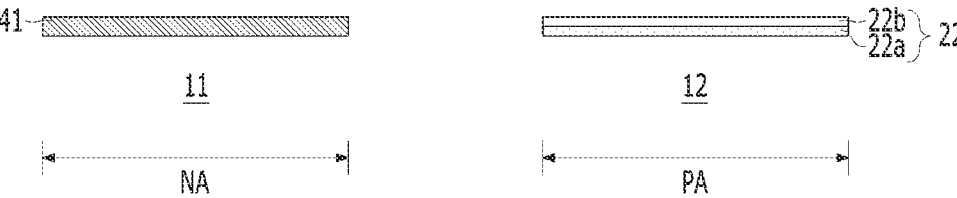

Referring to FIG. 9, the method may further include removing the mask pattern M and the silicon source layer 35. The first lower gate insulating layer 41 may be exposed in the NMOS area NA and the second preliminary lower gate insulating layer 22 may be exposed in the PMOS area PA.

Figure 10:
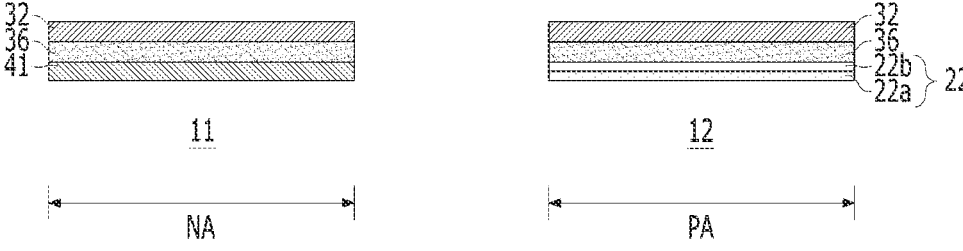

Referring to FIG. 10, the method may further include forming a high-k material layer 36 by performing a deposition process, and forming a second dipole source layer 32 on the high-k material layer 36. The high-k material layer 36 may be formed on the first lower gate insulating layer 41 in the NMOS area NA and on the second preliminary lower gate insulating layer 22 in the PMOS area PA. The high-k material layer 36 may include a metal oxide layer. For example, the high-k material layer 36 may include a hafnium oxide (HfO) layer. Forming the second dipole source layer 32 may include forming an insulating layer with the second dipole material on the high-k material layer 36 by performing a deposition process. The second dipole material may include a P-type dipole material lowering a threshold voltage of the PMOS transistor. For example, the second dipole material may include aluminum (Al). Accordingly, the second dipole source layer 32 may include aluminum oxide (AlO). In an embodiment, the second dipole source layer 32 may include high-k aluminum oxide. For example, the second dipole source layer 32 may include hafnium aluminum oxide (HfAlO). In another embodiment, the second dipole material may include niobium (Nb). Accordingly, the second dipole source layer 32 may include niobium oxide (NbO) or hafnium niobium oxide (HfNbO). The second dipole source layer 32 may include the materials of the high-k material layer 36, and may further include the second dipole material. Accordingly, the process of forming the second dipole source layer 32 may be performed in-situ with the process of forming the high-k material layer 36.

Figure 11:
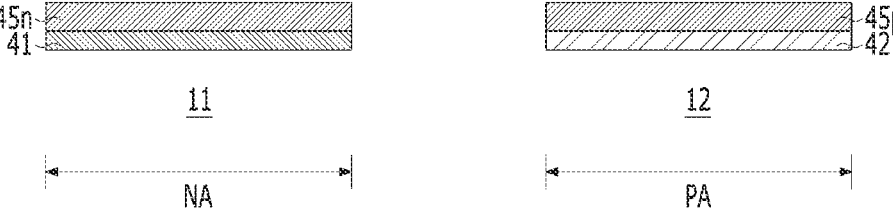

Referring to FIG. 11, the method may further include forming a second lower gate insulating layer 42 by performing a second annealing process and forming an upper gate insulating layer 45. During the second annealing process, the second dipole material in the bottom layer 22a may diffuse into the top layer 22b. The second dipole material in the second dipole source layer 32 may diffuse into the high-k material layer 36. Accordingly, the bottom layer 22a and the top layer 22b may be formed into a second lower gate insulating layer 42 including the second dipole material. The high-k material layer 36 may be formed into a first upper gate insulating layer 45n and a second upper gate insulating layer 45p each including the second dipole material. In an embodiment, the second dipole material in the bottom layer 22a may further diffuse into the high-k material layer 36. Accordingly, a concentration of the second dipole material in the second upper gate insulating layers 45p in the PMOS area PA may be higher than a concentration of the second dipole material in the first upper gate insulating layer 45n in the NMOS area NA. In another embodiment, the second dipole material of the second dipole source layer 32 may further diffuse into the top layer 22b. The second lower gate insulating layer 42 may include the second dipole material, silicon, and oxygen. For example, the second lower gate insulating layer 42 may include aluminum silicon oxide (AlSiO). In another embodiment, the second lower gate insulating layer 42 may include niobium silicon oxide (NbSiO) or aluminum niobium silicon oxide (AlNbSiO). The second dipole source layer 32 and the high-k material layer 36 may be formed into the first and second upper gate insulating layers 45n and 45p. Accordingly, the first and second upper gate insulating layers 45n and 45p may include the second dipole material, a high-k material, and oxygen. For example, the first and second upper gate insulating layers 45n and 45p may include hafnium aluminum oxide (HfAlO).

The first dipole material (e.g., lanthanum) in the first lower gate insulating layer 41 may block or retard diffusion of the second dipole material (e.g., aluminum). Accordingly, the second dipole material in the second dipole source layer 32 may not diffuse into the first lower gate insulating layer 41.

Figure 12:
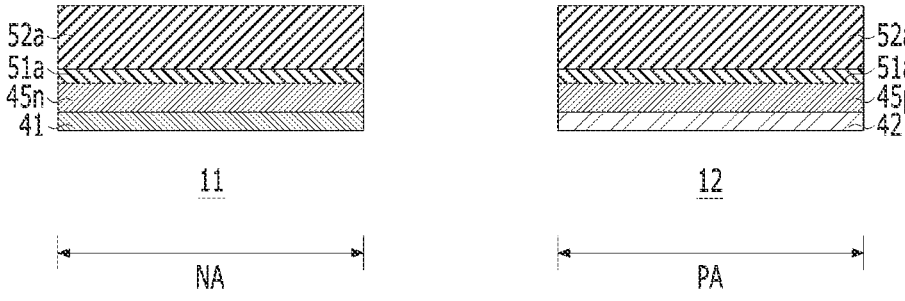

Referring to FIG. 12, the method may further include forming a gate barrier material layer 51a disposed on the first and second upper gate insulating layers 45n and 45p and forming a gate electrode material layer 52a on the gate barrier material layer 51a. Forming the gate barrier material layer 51a may include forming a barrier metal layer such as, for example, a titanium nitride (TiN) layer, a titanium/titanium nitride (Ti/TiN) layer, a tantalum nitride (TaN) layer, or a tantalum/tantalum nitride (Ta/TaN) layer, or a barrier metal compound layer by performing a deposition process. Forming the gate electrode material layer 52a may include forming a metal layer such as, for example, a tungsten (W) layer by performing a deposition process.

Figure 13:
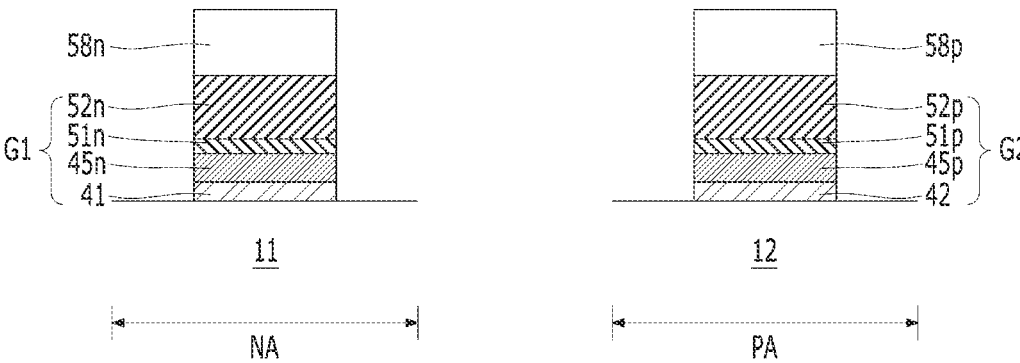

Referring to FIG. 13, the method may further include forming first and second hard mask patterns 58n and 58p on the gate electrode material layer 52a by performing a deposition process, and forming first and second gate stacks G1 and G2 by performing a patterning process to selectively etch the gate electrode material layer 52a, the gate barrier material layer 51a, the first and second upper gate insulating layers 45n and 45p, and the first and second lower gate insulating layers 41 and 42 using the first and second hard mask patterns 58n and 58p as etch masks. The first gate stack G1 may include the first lower gate insulating layer 41, the first upper gate insulating layer 45n, a first gate barrier layer 51$n$, and a first gate electrode 52$n$. The second gate stack G2 may include the second lower gate insulating layer 42, the second upper gate insulating layer 45$p$, a second gate barrier layer 51$p$, and a second gate electrode 52$p$.

Thereafter, referring to FIG. 2, the method may further include forming first and second inner gate spacer 61$n$ and 61$p$, and forming first and second outer gate spacers 62$n$ and 62$p$. Forming the first and second inner gate spacers 61$n$ and 61$p$ may include conformally forming a silicon oxide layer on surfaces of the first and second gate stacks G1 and G2 and the first and second hard mask patterns 58$n$ and 58$p$ by performing a deposition process. Forming the first and second outer gate spacers 62$n$ and 62$p$ may include forming a silicon nitride layer on entire surfaces of the first and second inner gate spacers 61$n$ and 61$p$ and performing an etch-back process to etch-back the silicon nitride layer. In an embodiment, the first and second outer gate spacers 62$n$ and 62$p$ may be formed on side surfaces of the first and second gate stacks G1 and G2 and the first and second hard mask patterns 58$n$ and 58$p$, and top surfaces of the first and second inner gate spacers 61$n$ and 61$p$ or top surfaces of the first and second hard mask patterns 58$n$ and 58$p$ may be exposed.

According to the embodiment of the present disclosure, the NMOS transistor 100 having the first gate insulating layer 41 with the N-type dipole material and the PMOS transistor 200 having the second gate insulating layer 42 with the P-type dipole material can be formed at the same time by an integrated process.

Figure 14:
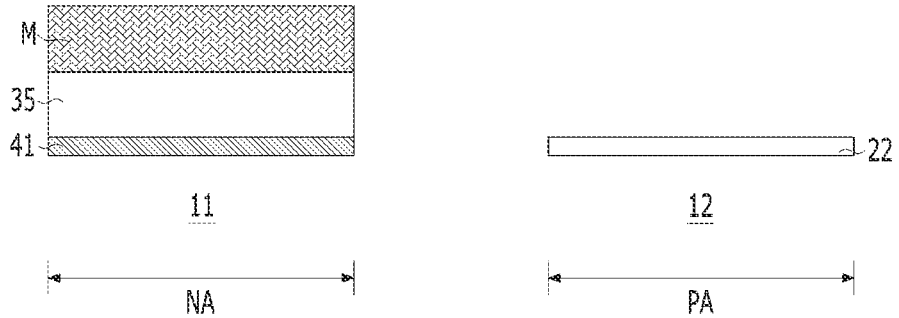
FIGS. 14 and 15 are longitudinal cross-sectional views illustrating a method of manufacturing an NMOS transistor and a PMOS transistor of a semiconductor device according to an embodiment of the present disclosure.
Figure 15:
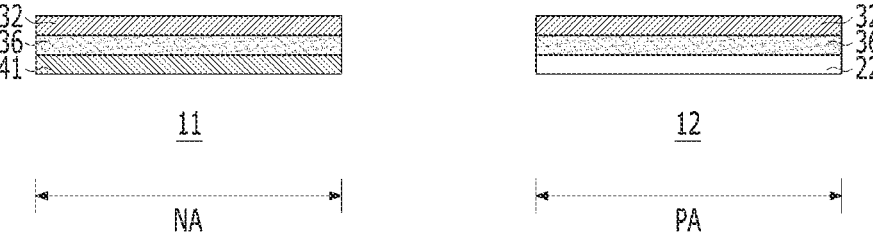

FIGS. 14 and 15 are longitudinal cross-sectional views illustrating a method of manufacturing an NMOS transistor and a PMOS transistor of a semiconductor device according to an embodiment of the present disclosure. Referring to FIG. 14, a method of manufacturing an NMOS transistor and a PMOS transistor of a semiconductor device according to an embodiment of the present disclosure may include forming a first lower gate insulating layer 41, a silicon source layer 35, and a mask pattern M on an N-channel substrate 11 of an NMOS area NA by performing the processes described with reference to FIGS. 4 to 7, and forming a second preliminary lower gate insulating layer 22 on a P-channel substrate 12 of a PMOS area PA. Forming the second preliminary lower gate insulating layer 22 may include oxidizing a surface of the P-channel substrate 12 or depositing a silicon oxide layer on the surface of the P-channel substrate 12.

Referring to FIG. 15, the method further include removing the mask pattern M and the silicon source layer 35 and forming a high-k material layer 36 and a second dipole source layer 32 by performing the processes described with reference to FIGS. 9 and 10. Thereafter, the method may further include forming a second lower gate insulating layer 42, forming a first and second upper gate insulating layers 45$n$ and 45$p$, forming gate stacks G1 and G2, and forming first and second gate spacers 61$n$ and 61$p$, 62$n$, and 62$p$ by performing the processes described with reference to FIGS. 12 to 14 and FIG. 2.

In this embodiment, the first dipole source layer 31 may be directly formed on the first preliminary lower gate insulating layer 21. The second dipole source layer 32 may be formed on the second preliminary lower gate insulating layer 22 to be spaced apart from the second preliminary lower gate insulating layer 22. That is, the high-k material layer 36 may be formed between the first preliminary lower gate insulating layer 21 and the second dipole source layer 32. Accordingly, the second lower gate insulating layer 42 may be formed so that a high concentration region of the second dipole material may be spaced apart from the surface of the P-channel substrate 12. That is, a concentration of the second dipole material in the first and second upper gate insulating layers 45$n$ and 45$p$ may be higher than a concentration of the second dipole material in the second lower gate insulating layer 42. In addition, the highest concentration region of the first dipole material may be located in the first lower gate insulating layer 41 adjacent to the surface of the N-channel substrate 11. The highest concentration region of the second dipole material may be located in the first and second upper gate insulating layer 45$n$ and 45$p$ to be spaced apart from the surface of the N-channel substrate 11 and the P-channel substrate 12.

Figure 16:
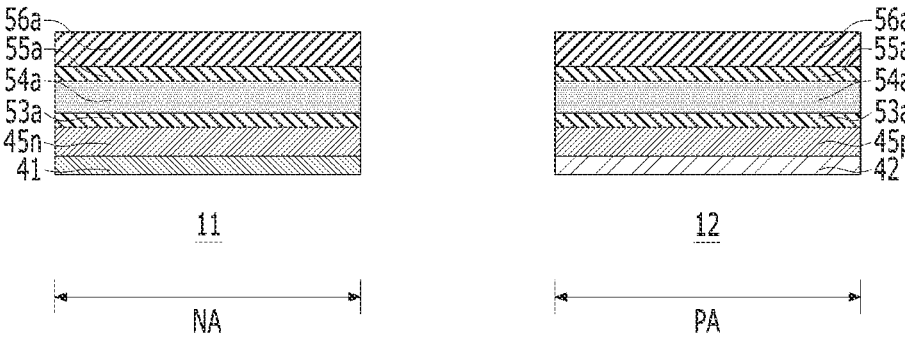
FIGS. 16 and 17 are longitudinal cross-sectional views illustrating a method of manufacturing an NMOS transistor and a PMOS transistor of a semiconductor device according to an embodiment of the present disclosure.
Figure 17:
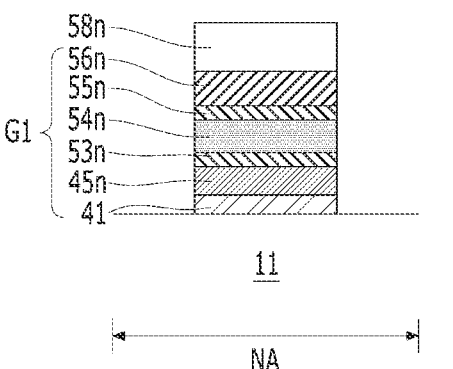
Figure 17:
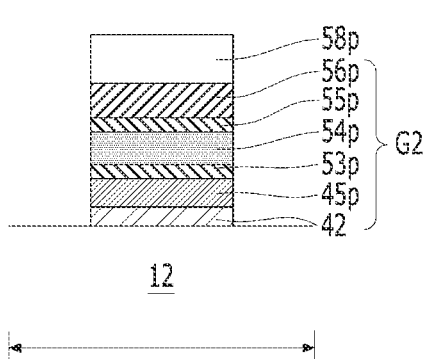

FIGS. 16 and 17 are longitudinal cross-sectional views illustrating a method of manufacturing an NMOS transistor and a PMOS transistor of a semiconductor device according to an embodiment of the present disclosure. Referring to FIG. 16, a method of manufacturing an NMOS transistor and a PMOS transistor of a semiconductor device according to an embodiment of the present disclosure may include forming first and second lower gate insulating layers 41 and 42 and first and second upper gate insulating layers 45$n$ and 45$p$ on an N-channel substrate 11 and a P-channel substrate 12 by performing the processes with reference to FIGS. 4 to 11, forming a lower gate barrier material layer 53$a$ on the first and second upper gate insulating layers 45$n$ and 45$p$, forming a lower gate electrode material layer 54$a$ on the lower gate barrier material layer 53$a$, forming an upper gate barrier material layer 55$a$ on the lower gate electrode material layer 54$a$, and forming an upper gate electrode material layer 56$a$ on the upper gate barrier material layer 55$a$. Forming the lower gate barrier material layer 53$a$ may further include forming a barrier metal or barrier metal compound layer such as, for example, titanium nitride (TiN), titanium/titanium nitride (Ti/TiN), tantalum nitride (TaN), or tantalum/tantalum nitride (Ta/TaN) by performing a deposition process. Forming the lower gate electrode material layer 54$a$ may include forming an N-doped polysilicon layer by performing a deposition process. Forming the upper gate barrier material layer 55$a$ may include forming a barrier metal or barrier metal compound layer such as, for example, titanium nitride (TiN), titanium/titanium nitride (Ti/TiN), tantalum nitride (TaN), or tantalum/tantalum nitride (Ta/TaN) by performing a deposition process. Forming the upper gate electrode material layer 56$a$ may include forming a metal layer such as, for example, tungsten (W) by performing a deposition process.

Referring to FIG. 17, the method may further include forming first and second hard mask patterns 58$n$ and 58$p$ on the upper gate electrode material layer 56$a$, and forming first and second gate stacks G1 and G2 by selectively etching the upper gate electrode material layer 56$a$, the upper gate barrier material layer 55$a$, the lower gate electrode material layer 54$a$, the lower gate barrier material layer 53$a$, the first and second upper gate insulating layers 45$n$ and 45$p$, and the first and second lower gate insulating layers 41 and 42 using the first and second hard mask patterns 58$n$ and 58$p$ as etch masks by performing a patterning process of selectively etching the second lower gate insulating layers 41 and 42 by performing the processes described with reference to FIG. 13. The first gate stack G1 may include the first lower gate insulating layer 41, the first upper gate insulating layer 45$n$, a first lower gate barrier layer 53$n$, a first lower gate electrode 54$n$, a first upper gate barrier layer 55$n$, and a first upper gate electrode 56$n$. The second gate stack G2 may include the second lower gate insulating layer 42, the second upper gate insulating layer 45$p$, a second lower gate barrier layer 53$p$, and a second lower gate electrode 54$p$, a second upper gate barrier layer 55p, and a second upper gate electrode 56p. Thereafter, referring to FIG. 3, the method may further include forming a first and second inner gate spacers 61n and 61p and a first and second outer gate spacers 62n and 62p.

According to the embodiments of the present disclosure, the NMOS transistor may include a gate insulating layer with an N-type dipole material. The PMOS transistor may include a gate insulating layer with a P-type dipole material. Thus, the threshold voltage of the NMOS transistor and the threshold voltage of the PMOS transistor can be lowered. According to the embodiments of the present disclosure, both a thickness of the inversion region (N-channel thickness) of the NMOS transistor and a thickness of the inversion region (P-channel thickness) of the PMOS transistor can be improved.

While the present invention has been described with respect to the specific embodiments, it will be apparent to those skilled in the art that various changes and modifications may be made without departing from the spirit and scope of the invention as defined in the following claims.

What is claimed is:

1. A semiconductor device comprising:
a first gate stack and a second gate stack disposed on a substrate,
wherein:
the first gate stack includes a first lower gate insulating layer,
the second gate stack includes a second lower gate insulating layer,
the first lower gate insulating layer includes silicon oxide with a first dipole material,
the second lower gate insulating layer includes silicon oxide with a second dipole material, and
the first dipole material and the second dipole material are different from each other, and
wherein:
the first gate stack includes a first upper gate insulating layer disposed on the first lower gate insulating layer, and the second gate stack includes a second upper gate insulating layer disposed on the second lower gate insulating layer,
each of the first and second upper gate insulating layers includes a high-k material and an oxide with the second dipole material,
a highest concentration region of the first dipole material is located in the first lower gate insulating layer, and
a highest concentration region of the second dipole material is located in the second upper gate insulating layer.

2. The semiconductor device of claim 1, wherein:
the first dipole material includes an N-type dipole material, and
the second dipole material includes a P-type dipole material.

3. The semiconductor device of claim 2, wherein the N-type dipole material includes at least one of lanthanum (La), scandium (Sc), erbium (Er), and strontium (Sr).

4. The semiconductor device of claim 2, wherein the P-type dipole material includes at least one of aluminum (Al) and niobium (Nb).

5. The semiconductor device of claim 2, wherein:
the first lower gate insulating layer includes lanthanum (La), silicon (Si), and oxygen (O), and
the second lower gate insulating layer includes aluminum (Al), silicon (Si), and oxygen (O).

6. The semiconductor device of claim 1, wherein the first and second upper gate insulating layers include hafnium (Hf), aluminum (Al), and oxygen (O).

7. The semiconductor device of claim 1, wherein the high dielectric material includes at least one of hafnium (Hf), bismuth (Bi), barium (Ba), or zirconium (Zr).

8. The semiconductor device of claim 1, wherein the second dipole material in the second lower gate insulating layer and the second dipole material in the first and second upper gate insulating layers are the same.

9. The semiconductor device of claim 1, wherein a concentration of the first dipole material in the first lower gate insulating layer is higher than a concentration of the second dipole material in the second lower gate insulating layer.

10. The semiconductor device of claim 1, wherein a highest concentration region of the first dipole material is located closer to the substrate than a highest concentration region of the second dipole material.

11. A semiconductor device comprising:
a substrate having a first area and a second area;
a first gate stack disposed on the first area of the substrate; and
a second gate stack disposed on the second area of the substrate,
wherein:
the first gate stack comprises:
a first gate insulating layer disposed on the substrate; and
a first gate electrode on the first gate insulating layer, and
the second gate stack comprises:
a second gate insulating layer disposed on the substrate; and
a second gate electrode on the second gate insulating layer,
wherein:
the first gate insulating layer includes an N-type dipole material, and
the second gate insulating layer includes a P-type dipole material, and
wherein:
the first gate insulating layer includes a first lower gate insulating layer and a first upper gate insulating layer disposed on the first lower gate insulating layer,
the second gate insulating layer includes a second lower gate insulating layer and a second upper gate insulating layer disposed on the second lower gate insulating layer,
the first lower gate insulating layer includes the N-type dipole material,
the second lower gate insulating layer includes the P-type dipole material,
the first upper gate insulating layer includes a N-type dipole free material, and
the N-type dipole free material includes a high-k material and an oxide with the P-type dipole material.

12. The semiconductor device of claim 11, wherein:
the N-type dipole material includes lanthanum (La), and
the P-type dipole material includes aluminum (Al).

13. The semiconductor device of claim 12, wherein the first lower gate insulating layer may include lanthanum silicon oxide (LaSiO).

14. The semiconductor device of claim 12, wherein the second lower gate insulating layer includes aluminum silicon oxide (AlSiO).

15. The semiconductor device of claim 11, wherein the first upper gate insulating layer and the second upper gate insulating layer include hafnium aluminum oxide (HfAlO).

16. A semiconductor device comprising:

a first gate stack comprising a first lower gate insulating layer, a first upper gate insulating layer, a first gate barrier layer, and a first gate electrode stacked over a first substrate;

a second gate stack comprising a second lower gate insulating layer, a second upper gate insulating layer, a second gate barrier layer, and a second gate electrode stacked over a second substrate, wherein the first lower gate insulating layer includes silicon oxide with a first dipole material and the second lower gate insulating layer includes silicon oxide with a second dipole material, and wherein a highest concentration region of the first dipole material is located in the first lower gate insulating layer adjacent to a surface of the first substrate.

*    *    *    *    *